United States Patent
Choi et al.

(10) Patent No.: US 8,345,492 B2
(45) Date of Patent: Jan. 1, 2013

(54) MEMORY CONTROLLER FOR DETECTING READ LATENCY, MEMORY SYSTEM AND TEST SYSTEM HAVING THE SAME

(75) Inventors: Hun-Dae Choi, Seoul (KR); Young-Chan Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 410 days.

(21) Appl. No.: 12/781,846

(22) Filed: May 18, 2010

(65) Prior Publication Data

US 2010/0296352 A1 Nov. 25, 2010

(30) Foreign Application Priority Data

May 22, 2009 (KR) .................. 10-2009-0044879

(51) Int. Cl.
*G11C 7/00* (2006.01)
(52) U.S. Cl. ................ 365/194; 365/233.1; 365/189.07
(58) Field of Classification Search .................. 365/194, 365/233.1, 189.07, 201
See application file for complete search history.

(56) References Cited

U.S. PATENT DOCUMENTS

| | | | |
|---|---|---|---|
| 6,598,112 B1 | 7/2003 | Jordan et al. | |
| 2009/0316493 A1* | 12/2009 | Kim | 365/189.05 |
| 2010/0103754 A1* | 4/2010 | Kwak | 365/194 |

FOREIGN PATENT DOCUMENTS

| KR | 1020010065333 A | 7/2001 |
|---|---|---|
| KR | 1020030046801 A | 6/2003 |
| KR | 1020060129575 A | 12/2006 |

* cited by examiner

*Primary Examiner* — Huan Hoang
(74) *Attorney, Agent, or Firm* — Volentine & Whitt, PLLC

(57) ABSTRACT

A memory controller includes an I/O circuit, a read latency detector and a clock domain synchronizer. The I/O circuit transmits a first signal to a semiconductor memory device, receives a reflected signal returned from the semiconductor memory device, and delays the reflected signal in response to a delay selection signal to generate a second signal. The reflected signal is provided by reflection of the first signal from the semiconductor memory device. The read latency detector generates the first signal in response to a system clock signal, and generates a read latency signal in response to the system clock signal, a hold signal, and the second signal. The clock domain synchronizer generates the delay selection signal and the hold signal in response to the system clock signal and the second signal.

19 Claims, 15 Drawing Sheets

MEMORY CONTROLLER FOR DETECTING READ LATENCY, MEMORY SYSTEM AND TEST SYSTEM HAVING THE SAME

CROSS-REFERENCE TO RELATED APPLICATION

A claim of priority under 35 USC §119 is made to Korean Patent Application No. 2009-0044879, filed on May 22, 2009. The contents of which is herein incorporated by reference.

BACKGROUND

The inventive concepts described herein generally relate to a memory system, and more particularly to a memory controller for detecting read latency and a memory system having the same.

A test system includes a test chip or a memory controller disposed between an automatic test equipment (ATE) and a semiconductor memory. The memory controller or the test chip may interface between a high speed semiconductor memory device and a low speed ATE to test the high speed semiconductor memory device.

When the memory controller or the test chip samples data output from the semiconductor memory device, the memory controller or the test chip may need to set a starting point of valid data or a valid window of data. The memory controller or the test chip may further need to detect a read latency of the semiconductor memory device to set the valid window of sampling data.

SUMMARY

Exemplary embodiments of the inventive concept are generally related to a memory controller detecting a read latency, a memory system including a memory controller that has the memory controller, and a test system including the memory controller that has a test circuit detecting a read latency.

In some example embodiments of the inventive concept, a memory controller includes an input/output (I/O) circuit, a read latency detector and a clock domain synchronizer.

In an exemplary embodiment of the inventive concept, the I/O circuit transmits a first signal to a semiconductor memory device, receives a reflected signal returned from the semiconductor memory device, and delays the reflected signal in response to a delay selection signal to generate a second signal. The reflected signal is provided by reflection of the first signal from the semiconductor memory device. The read latency detector generates the first signal in response to a system clock signal and generates a read latency signal in response to the system clock signal, a hold signal, and the second signal. The clock domain synchronizer generates the delay selection signal and the hold signal in response to the system clock signal and the second signal.

In an exemplary embodiment, the read latency detector may generate a pre-read latency signal in response to the system clock signal, the hold signal and the second signal, and may generate the read latency signal by adding an inherent latency signal of the semiconductor memory device to the pre-read latency signal.

In an exemplary embodiment, the read latency detector may compare a third signal corresponding to the second signal with a fifth signal corresponding to the first signal, to generate the read latency signal.

The read latency detector may include a flip-flop. The flip-flop may sample the third signal in response to the fifth signal to generate a comparison signal. The read latency detector may include a counter. The counter may count a number of pulses of the third signal until a logic level of the comparison signal transitions from a first logic level to a second logic level, and may generate a pre-read latency signal responsive to the counted number of pulses.

The read latency detector may include an AND gate, a flip-flop, a transmission signal generator and a clock-based delay circuit. The AND gate may perform an AND operation on the second signal and the hold signal. The flip-flop may sample an output signal of the AND gate in response to the system clock signal, to generate the third signal. The transmission signal generator may generate a fourth signal in response to a calibration enable signal and the system clock signal. The clock-based delay circuit may delay the fourth signal in response to the system clock signal and the pre-read latency signal to generate the fifth signal.

In an exemplary embodiment, the I/O circuit outputs read data in response to data received from the semiconductor memory device.

In an exemplary embodiment, the clock domain synchronizer may include a phase detector, a timer and a shift register. The phase detector may detect a phase of the second signal in response to the system clock signal. The timer may generate the hold signal in response to a calibration enable signal and the second signal. The shift register may generate the delay selection signal in response to the hold signal and an output signal of the phase detector.

In some example embodiments of the inventive concept, a memory system includes a semiconductor memory device and a memory controller.

In an exemplary embodiment of the inventive concept, the memory controller generates a first signal, transmits the first signal to the semiconductor memory device, generates a second signal in response to a reflected signal returned from the semiconductor memory device, synchronizes the second signal with a system clock signal and compares the second signal with the first signal to generate a read latency signal. The reflected signal is provided by reflection of the first signal from the semiconductor memory device.

In an exemplary embodiment, the memory controller may include an input/output (I/O) circuit, a read latency detector and a clock domain synchronizer.

In an exemplary embodiment, the I/O circuit may transmit the first signal to the semiconductor memory device, may receive the reflected signal returned from the semiconductor memory device, and may delay the reflected signal in response to a delay selection signal to generate the second signal. The read latency detector may generate the first signal in response to the system clock signal, and may generate the read latency signal in response to the system clock signal, a hold signal, and the second signal. The clock domain synchronizer may generate the delay selection signal and the hold signal in response to the system clock signal and the second signal.

In some example embodiments of the inventive concept, a test system includes a semiconductor device and a test circuit.

In an exemplary embodiment, the test circuit generates a first signal, transmits the first signal to the semiconductor device, generates a second signal in response to a reflected signal returned from the semiconductor device, synchronizes the second signal with a system clock signal, and compares the second signal with the first signal to generate a read latency signal in a calibration mode. The test circuit compares a first data with a second data to determine whether the semiconductor device passes or fails in a test mode. The first data is transmitted to the semiconductor device and the second data is received from the semiconductor device.

In an exemplary embodiment, the test circuit may include an input/output (I/O) circuit, a read latency detector and a clock domain synchronizer.

In an exemplary embodiment, the input/output (I/O) circuit may transmit the first signal to the semiconductor device, may receive the reflected signal returned from the semiconductor device and may delay the reflected signal in response to a delay selection signal to generate the second signal. The reflected signal is provided by reflection of the first signal transmitted to the semiconductor device. The read latency detector may generate the first signal in response to the system clock signal and may generate the read latency signal in response to the system clock signal, a hold signal and the second signal. The clock domain synchronizer may generate the delay selection signal and the hold signal in response to the system clock signal and the second signal.

Accordingly, in the memory system or the test system according to some example embodiments, the memory controller and the test circuit may include the read latency detector, the clock domain synchronizer and the I/O circuit and may detect a read latency. The memory controller and the test circuit for detecting the read latency may set a valid window of the read data, thereby efficiently sampling the read data by using a clock signal. In addition, in the communication system that includes the circuit for detecting the read latency according to some example embodiments, a communication error rate may be reduced.

BRIEF DESCRIPTION OF THE DRAWINGS

The accompanying drawings are included to provide a further understanding of the embodiments of the inventive concept, and are incorporated and constitute a part of this specification. The drawings illustrate examples of embodiments of the inventive concept and, together with the description, serve to explain principles of the embodiments of the inventive concept, and wherein.

DETAILED DESCRIPTION OF THE EMBODIMENTS

Figure 1:
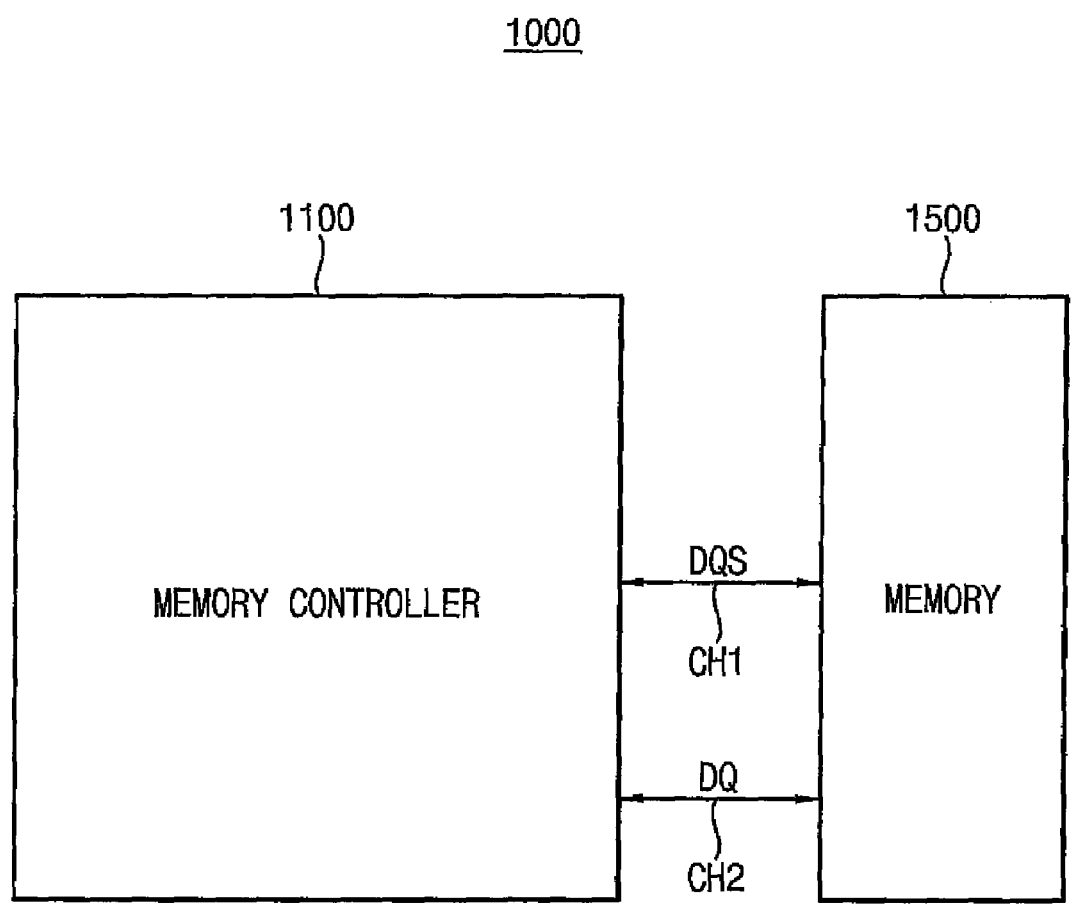
FIG. 1 is a block diagram illustrating a memory system according to an example embodiment of the inventive concept.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory system 1000 according to an example embodiment.

Referring to FIG. 1, the memory system 1000 includes a memory controller 1100 and a semiconductor memory device 1500. The semiconductor memory device 1500 communicates with the memory controller 1100 through a first channel CH1 and a second channel CH2. A data strobe signal DQS may be transmitted through the first channel CH1 and data DQ may be transmitted through the second channel CH2.

Figure 5:
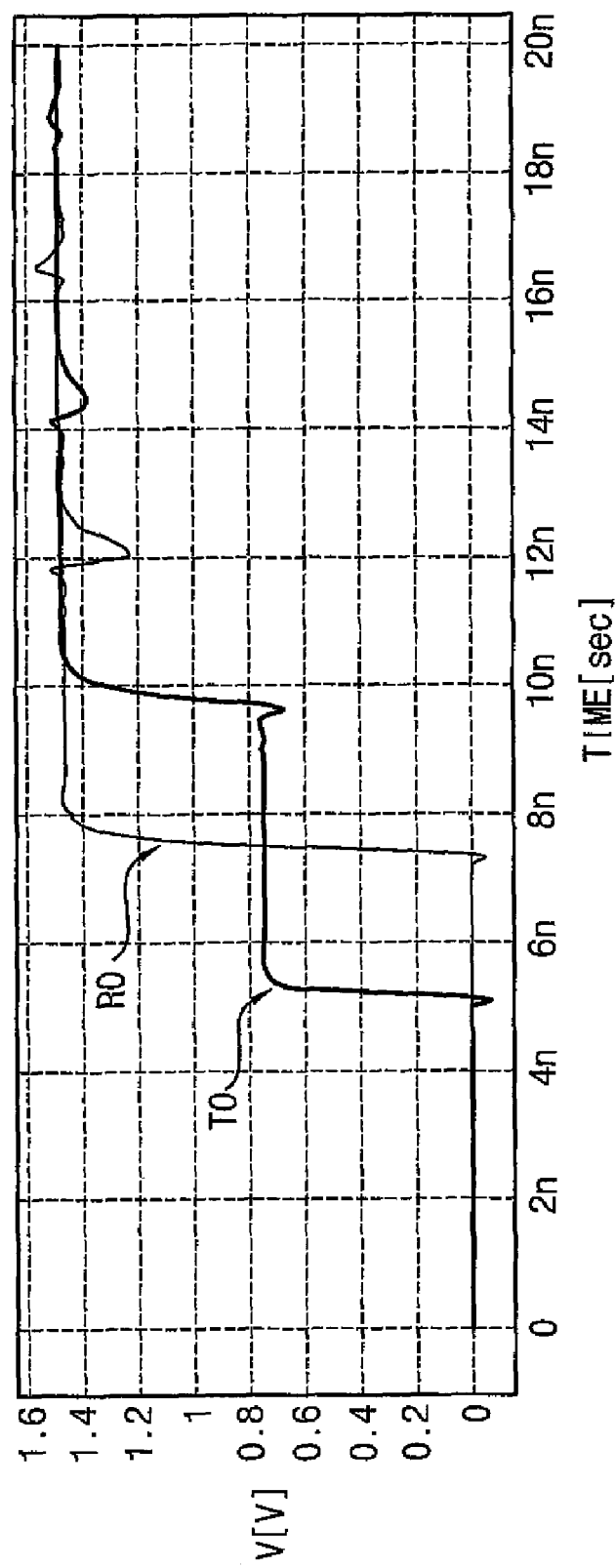
FIG. 5 is a diagram illustrating simulation results of voltages measured at first and second terminals of a channel included in the memory system of FIG. 1.

In a calibration mode, the memory controller 1100 generates a first signal, transmits the first signal to the semiconductor memory device 1500, generates a second signal in response to a reflected signal returned from the semiconductor memory device 1500, synchronizes the second signal with a system clock signal and compares the second signal with the first signal to generate a read latency signal. The first signal is transmitted to the semiconductor memory device 1500 through the first channel CH1. The reflected signal returns from an input terminal of the semiconductor memory device 1500 to the memory controller 1100 through the first channel CH1 by reflection of the first signal transmitted to the semiconductor memory device 1500. An example of voltages measured at a transmission terminal of the memory controller 1100 and at a reception terminal of the semiconductor memory device 1500 is illustrated in FIG. 5.

The memory controller 1100 may generate the first signal in response to a system clock signal and may generate the read latency signal based on the system clock signal, a hold signal, and the second signal. For example, the memory controller 1100 may generate a pre-read latency signal based on the system clock signal, the hold signal and the second signal, and may generate the read latency signal in response to an inherent latency signal of the semiconductor memory device 1500 and the pre-read latency signal.

A value of the pre-read latency signal may be a required time during which the first signal is transmitted to the semiconductor memory device 1500 and the reflected signal returns from the semiconductor memory device 1500. A value of the inherent latency signal may be an inherent latency of the semiconductor memory device 1500 determined according to the standard of the semiconductor memory device 1500.

For example, the read latency signal may be generated by adding the inherent latency signal to the pre-read latency signal. A value of the read latency signal may correspond to the sum of the value of the pre-read latency signal and the value of the inherent latency signal.

Figure 2:
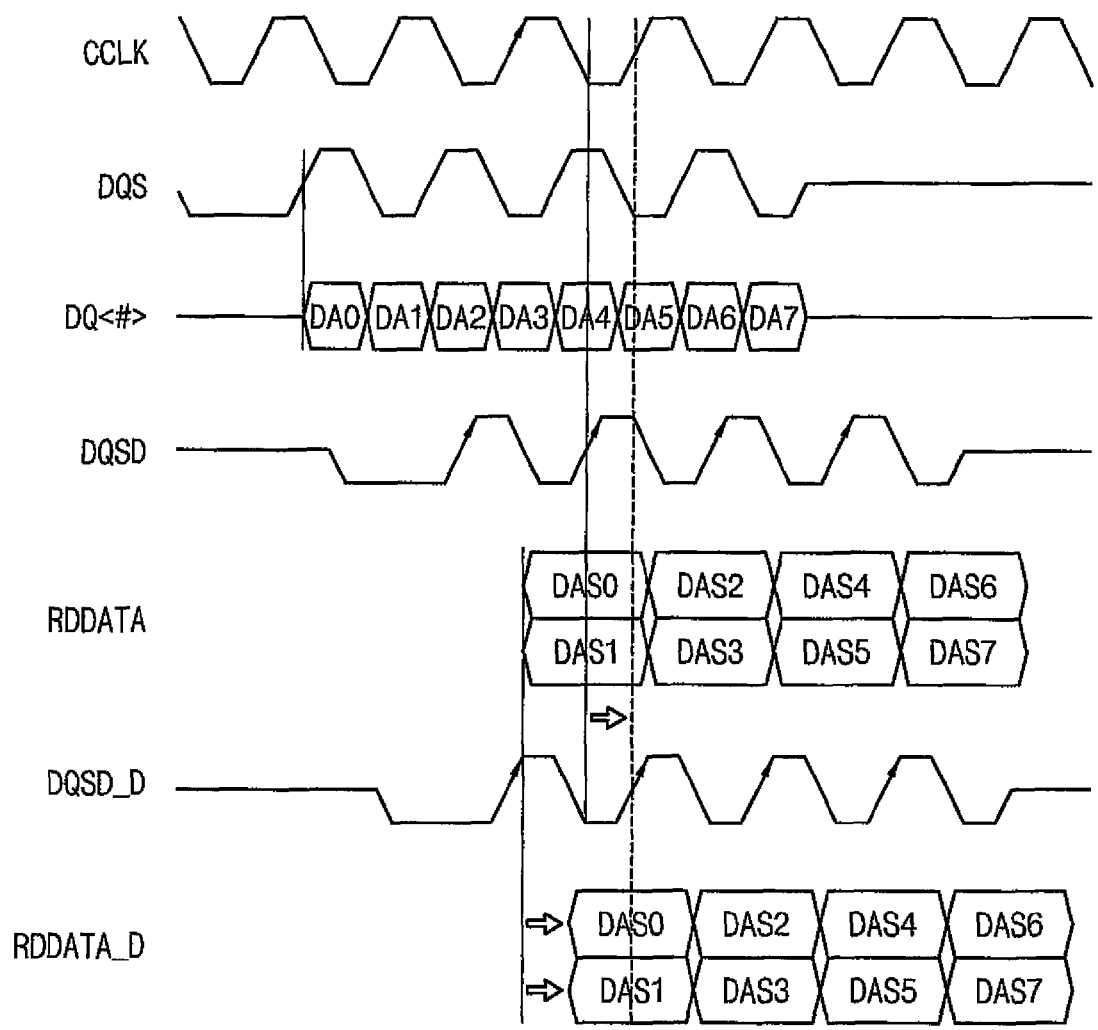
FIGS. 2 and 3 are timing diagrams illustrating clock domain synchronization of the memory system of FIG. 1.
Figure 3:
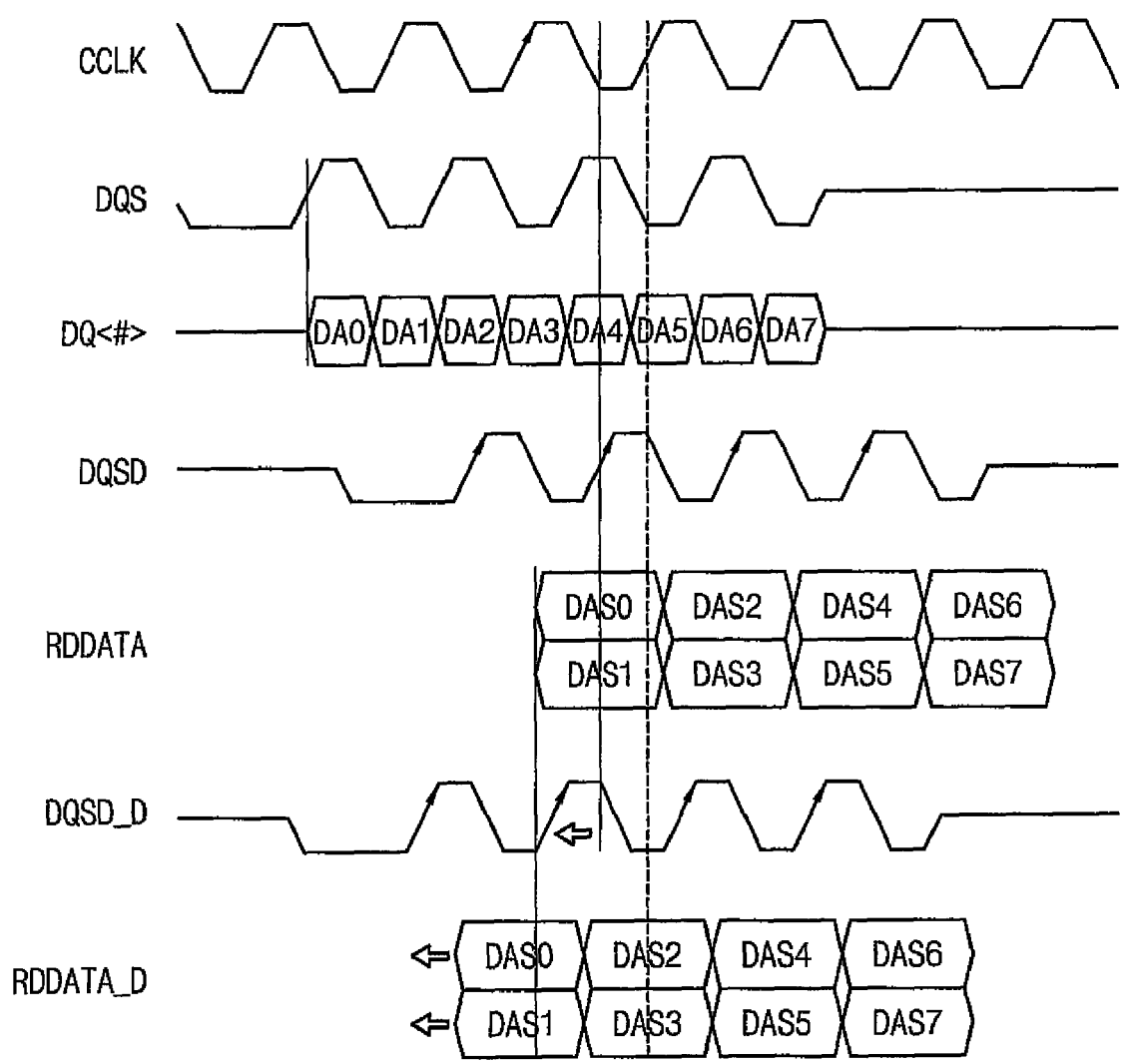

FIGS. 2 and 3 are timing diagrams illustrating a clock domain synchronization of the memory system 1000 of FIG. 1.

In FIGS. 2 and 3, CCLK, DQS, DQ, DQSD and RDDATA indicate a system clock signal, a data strobe signal, data, a delayed data strobe signal and a parallelized data, respectively. Referring to FIGS. 1, 2 and 3, the memory controller 1100 may receive the data strobe signal DQS and the data DQ from the semiconductor memory device 1500. An input/output (I/O) circuit included in the memory controller 1100 may delay the data strobe signal DQS to generate the delayed data strobe signal DQSD. The memory controller 1100 may parallelize the data DQ to generate the parallelized data RDDATA. In addition, in FIGS. 2 and 3, DQSD_D and RDDATA_D indicate a phase-modified data strobe signal and phase-modified data, respectively. The memory controller 1100 may modify a phase of the delayed data strobe signal DQSD to generate the phase-modified data strobe signal DQSD_D synchronized with the system clock signal CCLK. The memory controller 1100 may modify a phase of the parallelized data RDDATA to generate the phase-modified data RDDATA_D synchronized with the phase-modified data strobe signal DQSD_D.

Referring to the clock domain synchronization illustrated in FIG. 2, the memory controller 1100 may delay the delayed data strobe signal DQSD to generate the phase-modified data strobe signal DQSD_D and may delay the parallelized data RDDATA to generate the phase-modified data RDDATA_D, and thus the memory controller 1100 may synchronize the phase-modified data strobe signal DQSD_D with the system clock signal CCLK and may synchronize the phase-modified data RDDATA_D with the phase-modified data strobe signal DQSD_D.

Referring to the clock domain synchronization illustrated in FIG. 3, the memory controller 1100 may decrease the phase of the delayed data strobe signal DQSD to generate the phase-modified data strobe signal DQSD_D and may decrease the phase of the parallelized data RDDATA to generate the phase-modified data RDDATA_D, and thus the memory controller 1100 may synchronize the phase-modified data strobe signal DQSD_D with the system clock signal CCLK and may synchronize the phase-modified data RDDATA_D with the phase-modified data strobe signal DQSD_D.

Figure 4:
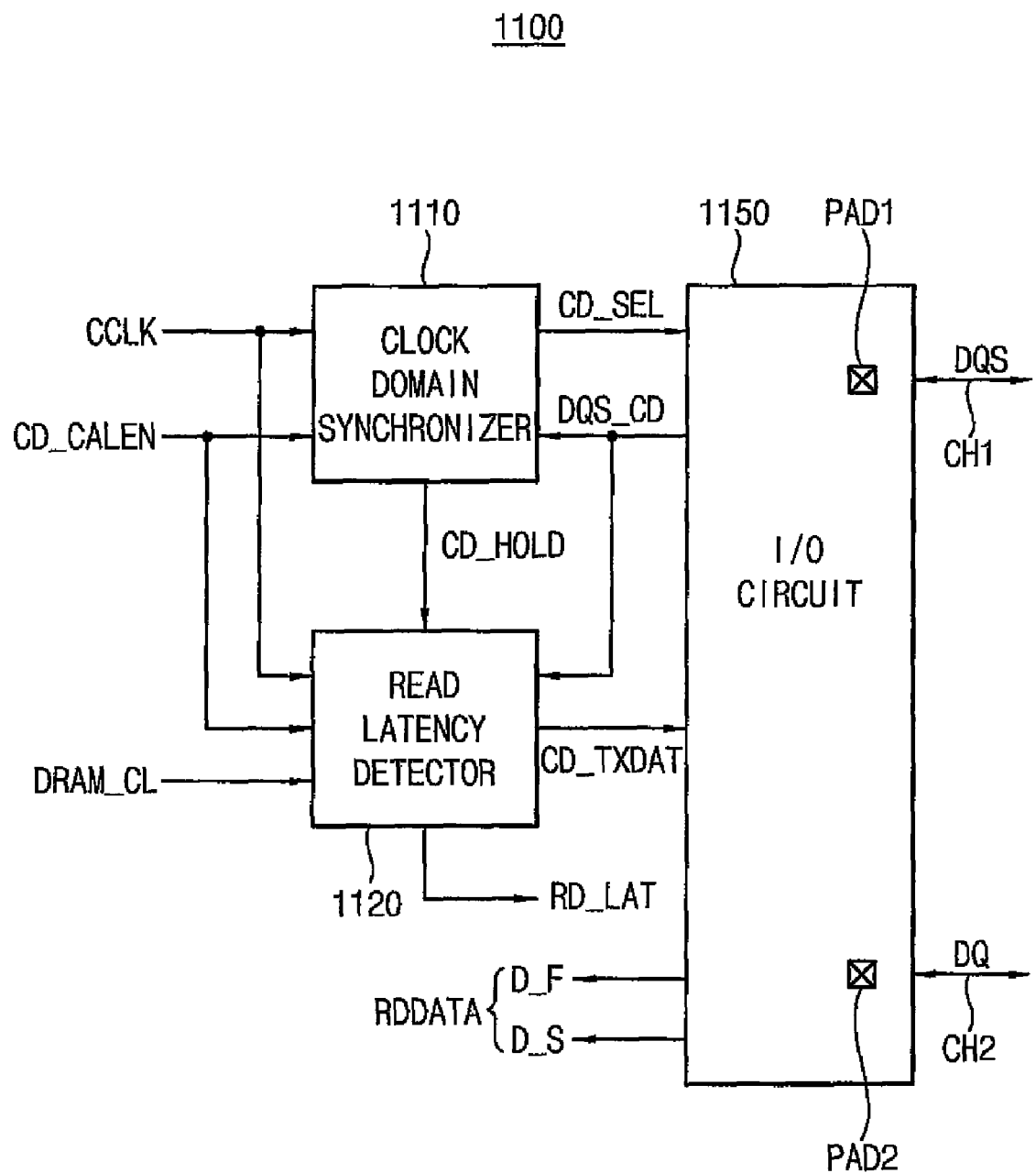
FIG. 4 is a block diagram illustrating an example of a memory controller included in the memory system of FIG. 1.

FIG. 4 is a block diagram illustrating an example of the memory controller 1100 included in the memory system 1000 of FIG. 1. Although FIG. 4 illustrates a read latency detecting circuit included in the memory controller 1100, the memory controller 1100 may further include other circuits controlling the semiconductor memory device 1500.

Referring to FIG. 4, the memory controller 1100 may include a clock domain synchronizer 1110, a read latency detector 1120 and an input/output (I/O) circuit 1150.

The read latency detector 1120 generates a first signal CD_TXDAT in response to a system clock signal CCLK and a calibration enable signal CD_CALEN, and generates a read latency signal RD_LAT based on the system clock signal CCLK, a hold signal CD_HOLD, a second signal DQS_CD and an inherent latency signal DRAM_CL of the semiconductor memory device 1500. The semiconductor memory device 1500 may be a Dynamic Random Access Memory (DRAM). The first signal CD_TXDAT is transmitted to the semiconductor memory device 1500 through the I/O circuit 1150 and the first channel CH1, and is reflected at the input terminal of the semiconductor memory device 1500. The reflected signal of the first signal CD_TXDAT returns from the semiconductor memory device 1500 through the first channel CH1 to the I/O circuit 1150. The second signal DQS_CD is generated in response to the reflected signal.

The clock domain synchronizer 1110 generates a delay selection signal CD_SEL and the hold signal CD_HOLD based on the system clock signal CCLK, the calibration enable signal CD_CALEN and the second signal DQS_CD.

The I/O circuit 1150 transmits the first signal CD_TXDAT to the semiconductor memory device 1500 through a first pad PAD1 and the first channel CH1, and generates the second signal DQS_CD in response to the reflected signal. The I/O circuit 1150 delays the reflected signal in response to the delay selection signal CD_SEL to generate the second signal DQS_CD. The I/O circuit 1150 generates read data RDDATA in response to data DQ received from the semiconductor memory device 1500 through the second channel CH2 and a second pad PAD2. The read data RDDATA may include odd-numbered data D_F and even-numbered data D_S.

FIG. 5 is a diagram illustrating simulation results of voltages measured at first and second terminals of the channel CH1 included in the memory system 1000 of FIG. 1.

In FIG. 5, R0 indicates the voltage measured at an input terminal of the semiconductor memory device 1500 and T0 indicates the voltage measured at an output terminal of the I/O circuit 1150 included in the memory controller 1100. As simulation conditions, the semiconductor memory device 1500 is a double data rate 3 (DDR3) DRAM, a source voltage VDD is about 1.5V, a ground voltage is about 0V and a resistance of a termination resistor is about 34 Ω.

Referring to FIG. 5, the voltage R0 transitions from about 0V to about 1.5V at about 7.3 ns and remains at a logic high level. The voltage T0 transitions from about 0V to about 0.75V at about 5.1 ns, transitions from about 0.75V to about 1.5V at about 9.6 ns, and remains at a logic high level.

Figure 6:
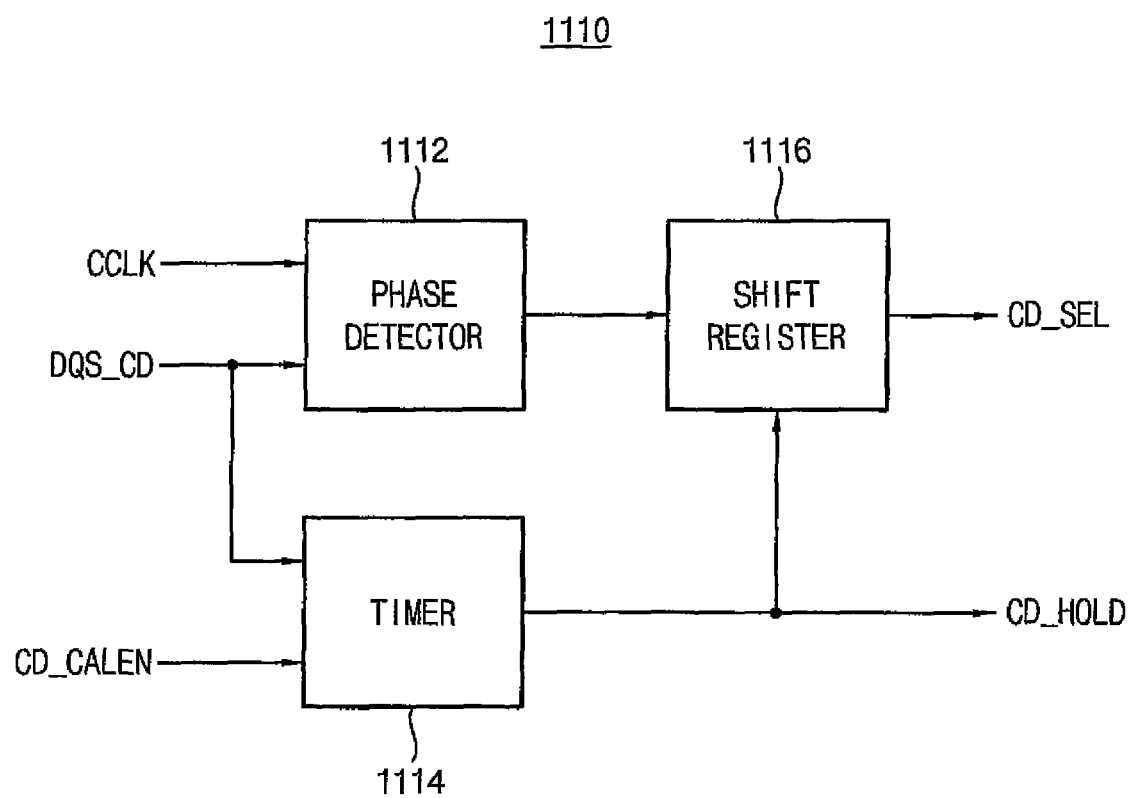
FIG. 6 is a block diagram illustrating an example of a clock domain synchronizer included in the memory controller of FIG. 4.

FIG. 6 is a block diagram illustrating an example of the clock domain synchronizer 1110 included in the memory controller 1100 of FIG. 4.

Referring to FIG. 6, the clock domain synchronizer 1110 includes a phase detector 1112, a timer 1114 and a shift register 1116.

The phase detector 1112 may detect a phase of the second signal DQS_CD in response to the system clock signal CCLK. The timer 1114 may generate the hold signal CD_HOLD based on the calibration enable signal CD_CALEN and the second signal DQS_CD. The shift register 1116 may generate the delay selection signal CD_SEL based on the hold signal CD_HOLD and an output signal of the phase detector 1112.

When a logic level of the hold signal CD_HOLD is a first logic level, such as logic low level, the clock domain synchronizer 1110 performs a clock domain calibration for solving the time uncertainty issue. When the logic level of the hold signal CD_HOLD is a second logic level, such as logic high level, the clock domain synchronizer 1110 holds the delay selection signal CD_SEL and the memory controller 1000 detects the read latency of the semiconductor memory device 1500.

Figure 7:
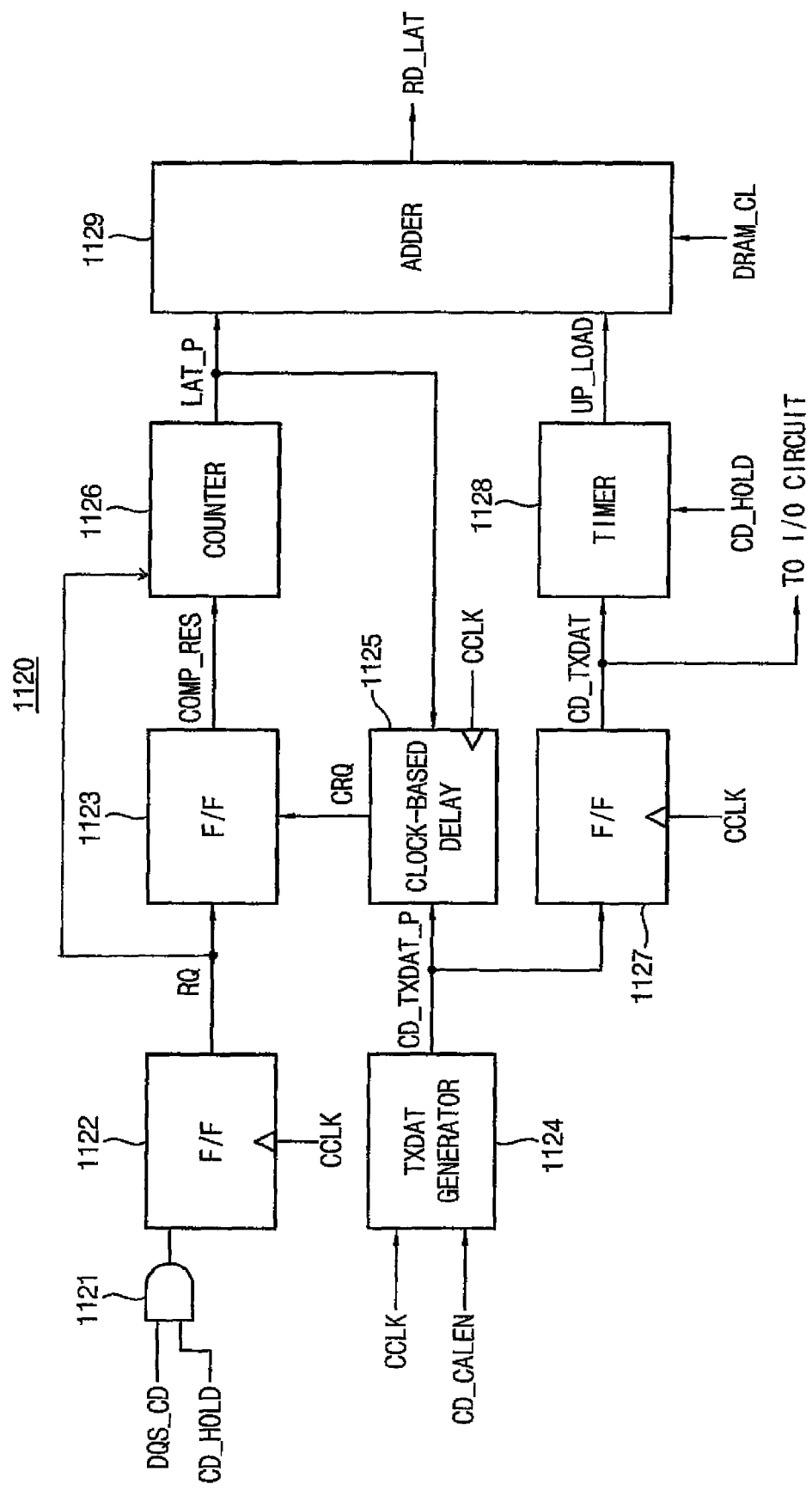
FIG. 7 is a block diagram illustrating an example of a read latency detector included in the memory controller of FIG. 4.

FIG. 7 is a block diagram illustrating an example of a read latency detector 1120 included in the memory controller 1100 of FIG. 4.

Referring to FIG. 7, the read latency detector 1120 includes an AND gate 1121, a first flip-flop 1122, a second flip-flop 1123, a transmission signal generator 1124, a clock-based delay circuit 1125, a counter 1126, a third flip-flop 1127, a timer 1128 and an adder 1129.

The AND gate 1121 may perform an AND operation on the second signal DQS_CD and the hold signal CD_HOLD. The first flip-flop 1122 may sample an output signal of the AND gate 1121 in response to the system clock signal CCLK to generate a third signal RQ. The transmission signal generator 1124 may generate a fourth signal CD_TXDAT_P based on the calibration enable signal CD_CALEN and the system clock signal CCLK such that a frequency of the fourth signal CD_TXDAT_P is lower than a frequency of the system clock signal CCLK. That is, a period of the fourth signal CD_TXDAT_P may be longer than that of the system clock signal CCLK. The clock-based delay circuit 1125 may delay the fourth signal CD_TXDAT_P in response to the system clock signal CCLK and a pre-read latency signal LAT_P to generate a fifth signal CRQ. The second flip-flop 1123 may sample the third signal RQ in response to the fifth signal CRQ to generate a comparison signal COMP_RES.

The counter 1126 may count the number of pulses of the third signal RQ until a logic level of the comparison signal COMP_RES transitions from a first logic level to a second logic level, and may generate the pre-read latency signal LAT_P responsive to the counted number of pulses. For example, the first logic level may be a logic low level and the second logic level may be a logic high level. The counter 1126 may be an up-counter.

The third flip-flop 1127 may sample the fourth signal CD_TXDAT_P in response to the system clock signal CCLK to generate the first signal CD_TXDAT. As described above, the first signal CD_TXDAT may be transmitted to the semiconductor memory device 1500 through the I/O circuit 1150 and the first channel CH1 in the calibration mode. The timer 1128 may generate an upload signal UP_LOAD in response to the hold signal CD_HOLD and the first signal CD_TXDAT. The adder 1129 may generate the read latency signal RD_LAT by adding the inherent latency signal DRAM_CL of the semiconductor memory device 1500 to the pre-read latency signal LAT_P in response to the upload signal UP_LOAD.

Figure 8:
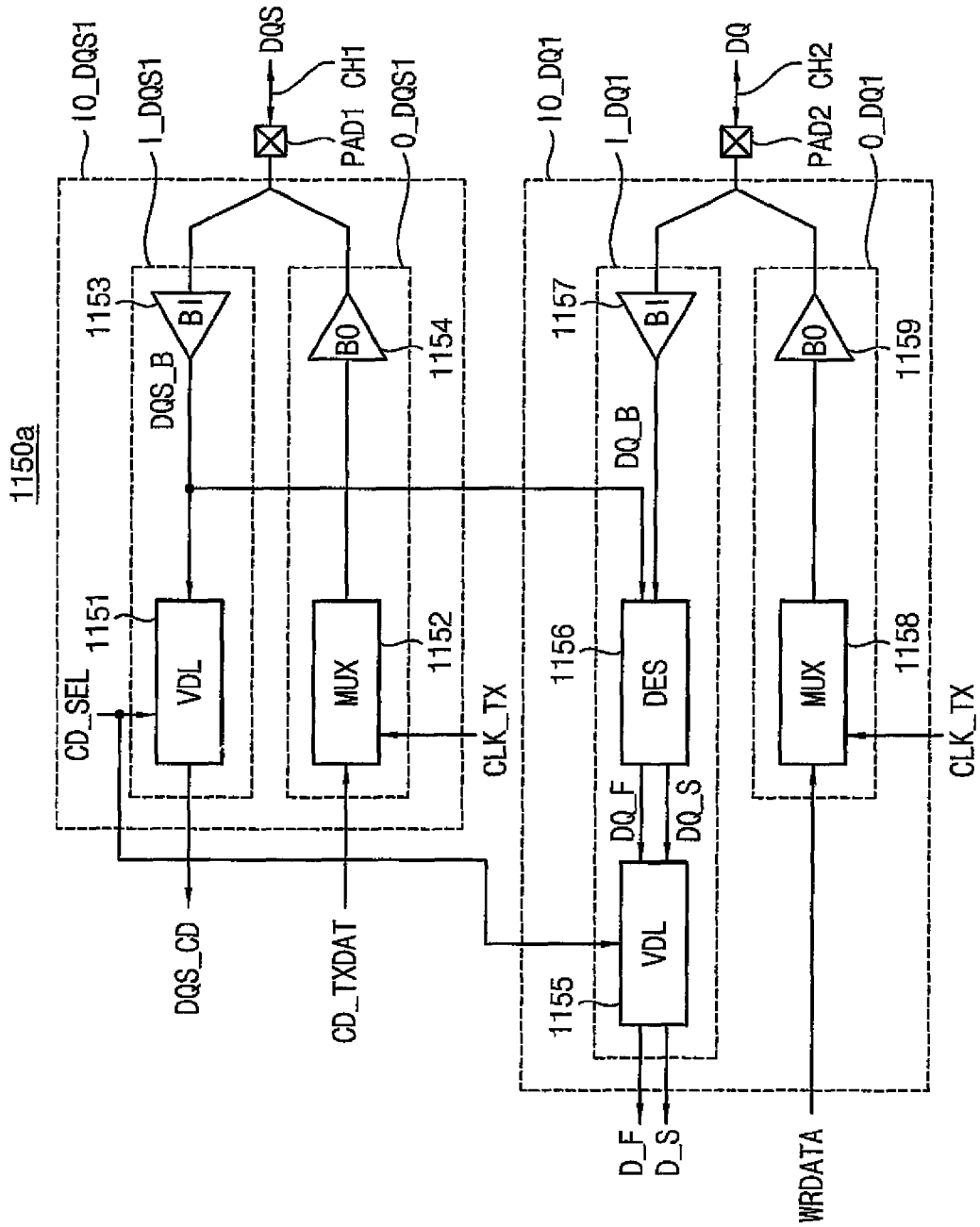
FIG. 8 is a block diagram illustrating an example of an input/output (I/O) circuit included in the memory controller of FIG. 4.

FIG. 8 is a block diagram illustrating an example of the I/O circuit 1150a included in the memory controller 1100 of FIG. 4.

Referring to FIG. 8, the I/O circuit 1150a includes a first strobe I/O unit IO_DQS1 and a first data I/O unit IO_DQ1.

The first strobe I/O unit IO_DQS1 may output the first signal CD_TXDAT in response to a transmission clock signal CLK_TX through the first pad PAD1, may receive the reflected signal of the first signal CD_TXDAT returned from the semiconductor memory device 1500 through the first channel CH1, and may delay the reflected signal in response to the delay selection signal CD_SEL to generate the second signal DQS_CD.

The first strobe I/O unit IO_DQS1 may include a first strobe output unit O_DQS1 and a first strobe input unit I_DQS1.

The first strobe output unit O_DQS1 may include a first multiplexer 1152 and a first buffer 1154. The first multiplexer 1152 may output the first signal CD_TXDAT in response to the transmission clock signal CLK_TX. The first buffer 1154 may buffer an output signal of the first multiplexer 1152.

The first strobe input unit I_DQS1 may include a second buffer 1153 and a first variable delay line 1151. The second buffer 1153 may buffer the reflected signal. The first variable delay line 1151 may delay an output signal DQS_B of the second buffer 1153 in response to the delay selection signal CD_SEL to generate the second signal DQS_CD.

The first data I/O unit I/O_DQ1 may output write data WRDATA in response to the transmission clock signal CLK_TX through the second pad PAD2, may receive data DQ from the semiconductor memory device 1500 through the second channel CH2, and may delay the received data DQ in response to the delay selection signal CD_SEL to generate the read data RDDATA. The read data RDDATA may include the odd-numbered data D_F and the even-numbered data D_S.

The first data I/O unit IO_DQ1 may include a first data output unit O_DQ1 and a first data input unit I_DQ1.

The first data output unit O_DQ1 may include a second multiplexer 1158 and a third buffer 1159. The second multiplexer 1158 may output the write data WRDATA in response to the transmission clock signal CLK_TX. The third buffer 1159 may buffer an output signal of the second multiplexer 1158.

The first data input unit I_DQ1 may include a fourth buffer 1157, a first deserializer 1156 and a second variable delay line 1155. The fourth buffer 1157 may buffer the received data DQ. The first deserializer 1156 may deserialize an output signal DQ_B of the fourth buffer 1157 in response to the output signal DQS_B of the second buffer 1153, and may generate odd-numbered pre-data DQ_F and even-numbered pre-data DQ_S. The second variable delay line 1155 may delay the odd-numbered pre-data DQ_F and the even-numbered pre-data DQ_S in response to the delay selection signal CD_SEL, and may output the read data RDDATA including the odd-numbered data D_F and the even-numbered data D_S.

Figure 9:
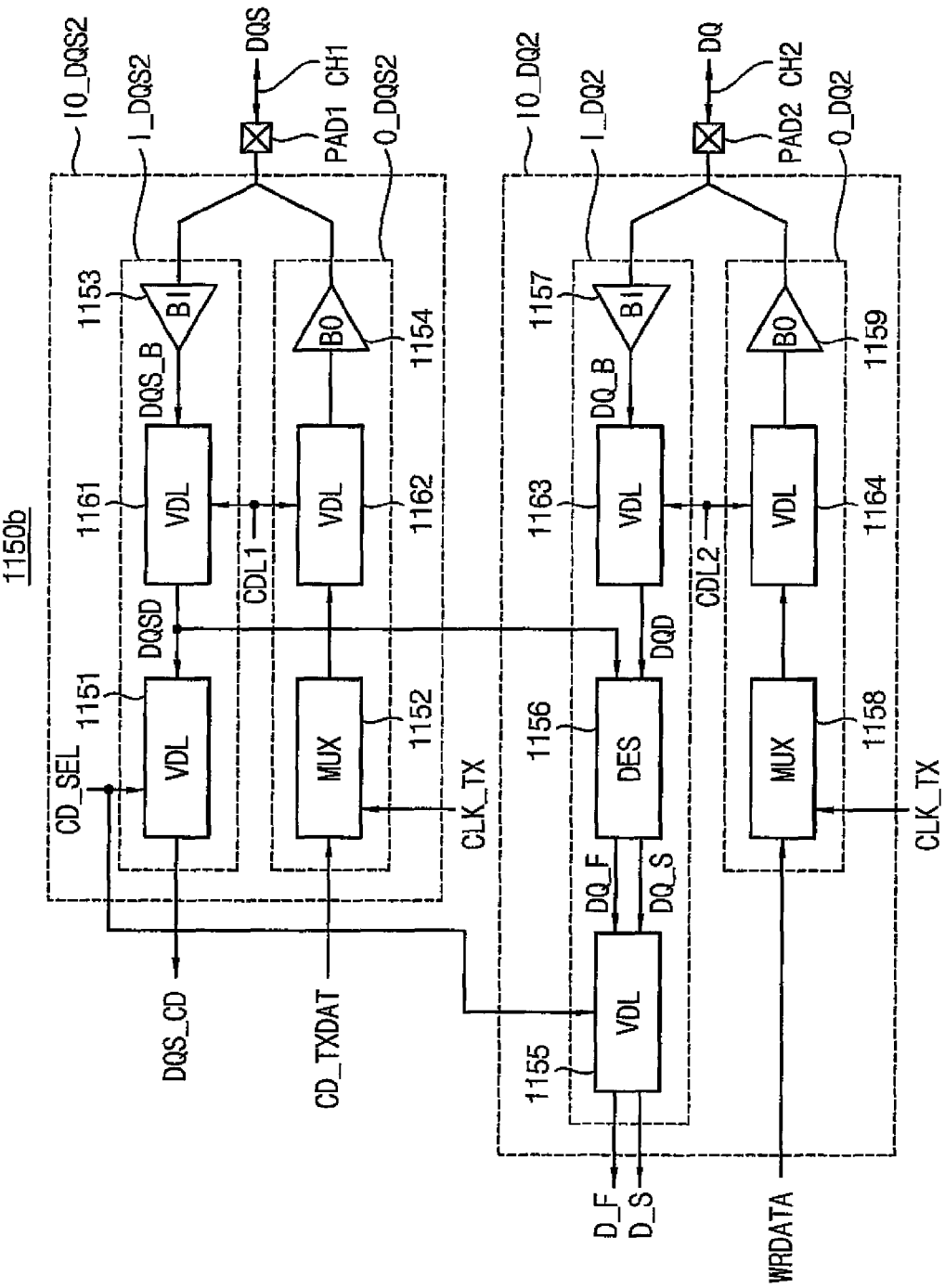
FIG. 9 is a block diagram illustrating another example of the I/O circuit included in the memory controller of FIG. 4.

FIG. 9 is a block diagram illustrating another example of the I/O circuit 1150b included in the memory controller 1100 of FIG. 4.

Referring to FIG. 9, the I/O circuit 1150b includes a second strobe I/O unit IO_DQS2 and a second data I/O unit IO_DQ2.

The second strobe I/O unit IO_DQS2 may output the first signal CD_TXDAT through the first pad PAD1 in response to a transmission clock signal CLK_TX and a first delay control signal CDL1, may receive the reflected signal of the first signal CD_TXDAT returned from the semiconductor memory device 1500 through the first channel CH1, and may delay the reflected signal in response to the first delay control signal CDL1 and the delay selection signal CD_SEL to generate the second signal DQS_CD. The first delay control signal CDL1 may be used to control a delay time of the signals for compensating skews of the channels disposed between the memory controller 1100 and the semiconductor memory device 1500. For example, the first delay control signal CDL1 may be generated in the memory controller 1100.

The second strobe I/O unit IO_DQS2 includes a second strobe output unit O_DQS2 and a second strobe input unit I_DQS2.

The second strobe output unit O_DQS2 may include a first multiplexer 1152, a third variable delay line 1162 and a first buffer 1154. The first multiplexer 1152 may output the first signal CD_TXDAT in response to the transmission clock signal CLK_TX. The third variable delay line 1162 may delay an output signal of the first multiplexer 1152 in response to the first delay control signal CDL1. The first buffer 1154 may buffer an output signal of the third variable delay line 1162.

The second strobe input unit I_DQS2 may include a second buffer 1153, a fourth variable delay line 1161 and a first variable delay line 1151. The second buffer 1153 may buffer the reflected signal. The fourth variable delay line 1161 may delay an output signal DQS_B of the second buffer 1153 in response to the first delay control signal CDL1. The first variable delay line 1151 may delay an output signal DQSD of the fourth variable delay line 1161 in response to the delay selection signal CD_SEL to generate the second signal DQS_CD.

The second data I/O unit IO_DQ2 may output the write data WRDATA through the second pad PAD2 in response to the transmission clock signal CLK_TX and a second delay control signal CDL2, may receive the data DQ from the semiconductor memory device 1500 through the second channel CH2, and may delay the received data DQ in response to the second delay control signal CDL2 and the delay selection signal CD_SEL to generate the read data RDDATA. The read data RDDATA may include the odd-numbered data D_F and the even-numbered data D_S. The second delay control signal CDL2 may be used to control a delay time of the signals for compensating skews of the channels disposed between the memory controller 1100 and the semiconductor memory device 1500. For example, the second delay control signal CDL2 may be generated in the memory controller 1100.

The second data I/O unit IO_DQ2 may include a second data output unit O_DQ2 and a second data input unit I_DQ2.

The second data output unit O_DQ2 may include a second multiplexer 1158, a fifth variable delay line 1164 and a third buffer 1159. The second multiplexer 1158 may output the write data WRDATA in response to the transmission clock signal CLK_TX. The fifth variable delay line 1164 may delay an output signal of the second multiplexer 1158 in response to the second delay control signal CDL2. The third buffer 1159 may buffer an output signal of the fifth variable delay line 1164.

The second data input unit I_DQ2 may include a fourth buffer 1157, a sixth variable delay line 1163, a first deserializer 1156 and a second variable delay line 1155. The fourth buffer 1157 may buffer the received data DQ. The sixth variable delay line 1163 may delay an output signal DQ_B of the fourth buffer 1157 in response to the second delay control signal CDL2. The first deserializer 1156 may deserialize an output signal DQD of the sixth variable delay line 1163 in response to the output signal DQSD of the fourth variable delay line 1161, and may generate the odd-numbered pre-data DQ_F and the even-numbered pre-data DQ_S. The second variable delay line 1156 may delay the odd-numbered pre-data DQ_F and the even-numbered pre-data DQ_S in response to the delay selection signal CD_SEL, and may output the read data RDDATA including the odd-numbered data D_F and the even-numbered data D_S.

Compared to the I/O circuit 1150a of FIG. 8, the I/O circuit 1150b of FIG. 9 further includes the third and fourth variable delay lines 1162 and 1161 that are used to control the delay time of the signals in response to the first delay control signal CDL1. In addition, the I/O circuit 1150b of FIG. 9 further includes the fifth and sixth variable delay lines 1164 and 1163 that are used to control the delay time of the signals in response to the second delay control signal CDL2. The third, fourth, fifth and sixth variable delay lines 1162, 1161, 1164 and 1163 may compensate skews of the channels disposed between the memory controller 1100 and the semiconductor memory device 1500.

Figure 10:
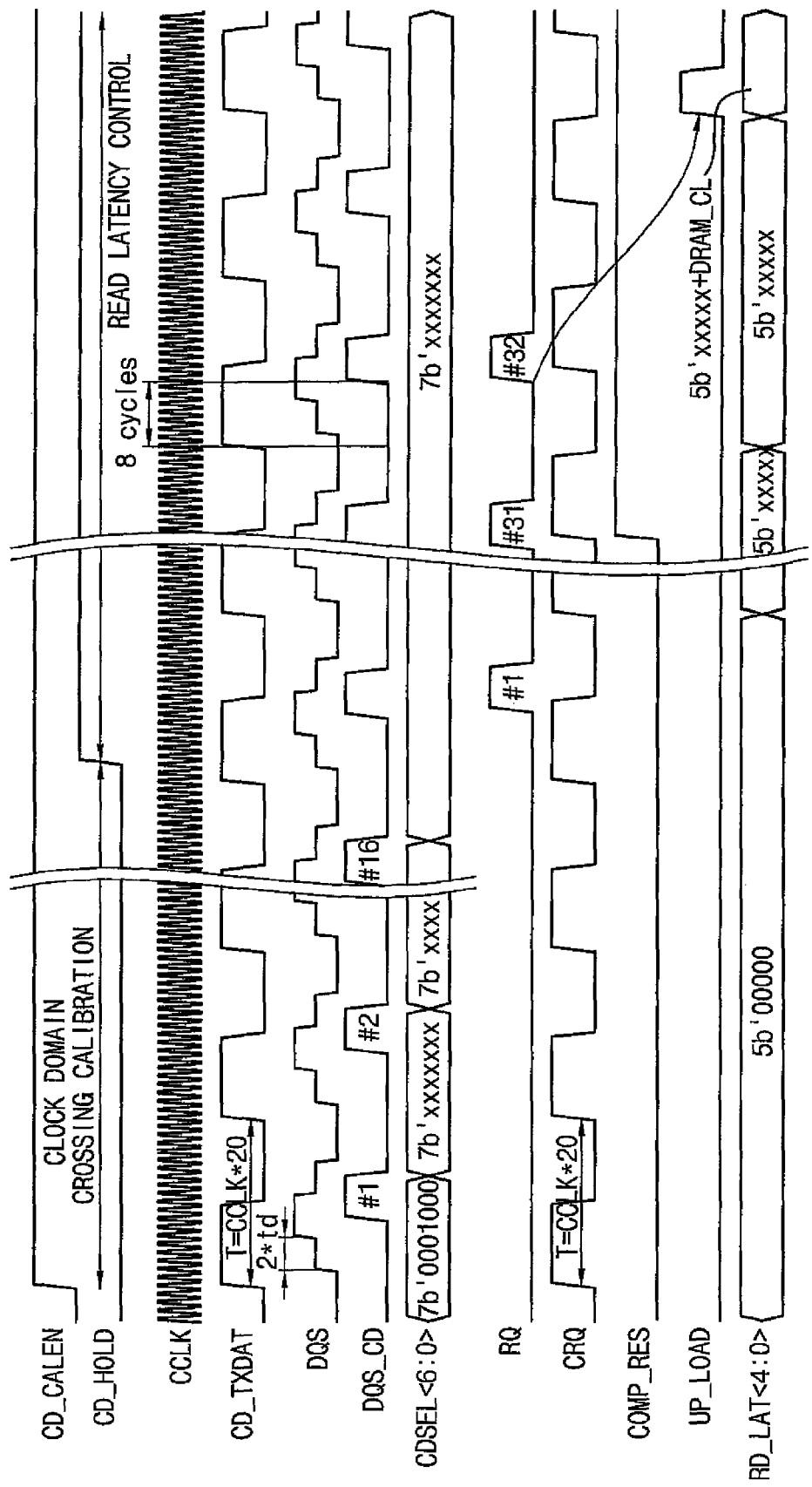
FIG. 10 is a timing diagram illustrating an operation of the memory controller of FIG. 4.

FIG. 10 is a timing diagram illustrating an operation of the memory controller 1100 of FIG. 4.

In FIG. 10, CD_CALEN, CD_HOLD, CCLK and CD_TXDAT indicate the calibration enable signal, the hold signal, the system clock signal and the first signal generated in the memory controller 1100, respectively. DQS and DQS_CD indicate a voltage measured at the first pad PAD1 and the second signal generated in response to the reflected signal of the first signal CD_TXDAT, respectively. CD_SEL, RQ, CRQ and COMP_RES indicate the delay selection signal, the third signal input to the second flip-flop 1123, the fifth signal input to the second flip-flop 1123 and the comparison signal output from the second flip-flop 1123, respectively. UP_LOAD indicates the enable signal that controls an adding operation of the inherent latency signal of the semiconductor memory device 1500 to the pre-read latency signal LAT_P. RD_LAT indicates the read latency signal.

In FIG. 10, frequencies of the first signal CD_TXDAT and the fifth signal CRQ is twenty times smaller than a frequency of the system clock signal CCLK. A period of time td indicates a delay time of the channel disposed between the memory controller 1100 and the semiconductor memory device 1500. A period of time 2*td indicates a required time during which the first signal CD_TXDAT is transmitted to the semiconductor memory device 1500 and returns as the reflected signal from the semiconductor memory device 1500 to the first pad PAD1. In addition, the delay selection signal CD_SEL is a seven bit signal CD_SEL<6:0> and the read latency signal RD_LAT is five bit signal RD_LAT<4:0>. The hold signal CD_HOLD is disabled while the clock domain synchronizer 1110 synchronizes the second signal DQS_CD with the system clock signal CCLK, and is enabled while the read latency detector 1120 generates the read latency signal RD_LAT.

Referring to FIG. 1 through FIG. 10, an operation of the memory system 1000 according to example embodiments of the inventive concept will be described.

In the calibration mode, the memory controller 1100 may detect a read latency based on the read latency signal. The read latency indicates a period of time during which a signal is transmitted from the memory controller 1100 to a memory cell array included in the semiconductor memory device 1500 and returns from the memory cell array to the memory controller 1100. The memory controller 1100 may determine a valid window or a valid range of the data read from the semiconductor memory device 1500 in the normal mode using the detected read latency.

Referring to FIG. 4 through FIG. 9, in the calibration mode, the read latency detector 1120 generates the first signal CD_TXDAT, and transmits the first signal CD_TXDAT to the semiconductor memory device 1500 through the I/O circuit 1150 and the first channel CH1. The reflected signal of the first signal CD_TXDAT returns from the semiconductor memory device 1500 to the memory controller 1100 through the first channel CH1 by reflection of the first signal CD_TXDAT at the input terminal of the semiconductor memory device 1500. The I/O circuit 1150 generates the second signal DQS_CD in response to the reflected signal.

The clock domain synchronizer 1110 detects the phase of the system clock signal CCLK to generate the delay selection signal CD_SEL. The delay time of the first variable delay line 1151 included in the I/O circuit 1150 is modified in response to the delay selection signal CD_SEL, and thus the second signal DQS_CD is synchronized with the system clock signal CCLK.

The read latency detector 1120 compares the first signal CD_TXDAT with the second signal DQS_CD to generate the read latency signal RD_LAT such that the first signal CD_TXDAT is generated in response to the system clock signal CCLK and the second signal DQS_CD is generated in response to the reflected signal DQS. The read latency detector 1120 may detect the read latency to provide the read latency signal RD_LAT.

Referring to FIG. 7, the read latency detector 1120 compares the third signal RQ with the fifth signal CRQ to generate the read latency signal RD_LAT. The third signal RQ may correspond to the second signal DQS_CD and the fifth signal CRQ may correspond to the first signal CD_TXDAT. The second flip-flop 1123 included in the read latency detector 1120 samples the third signal RQ in response to the fifth signal CRQ to generate the comparison signal COMP_RES. The counter 1126 included in the read latency detector 1120 counts the number of pulses of the third signal RQ until the logic level of the comparison signal COMP_RES is changed from the first logic level to the second logic level, and generates the pre-read latency signal LAT_P responsive to the counted number of pulses. The first logic level may be the logic low level and the second logic level may be the logic high level.

The read latency detector 1120 increases a delay time of the clock-based delay circuit 1125 in response to the pre-read latency signal LAT_P. The read latency detector 1120 also delays a phase of the fifth signal CRQ and compares the third signal RQ with the fifth signal CRQ. The read latency detector 1120 may repeat the increasing operation, the delaying operation and the comparing operation until the logic level of the comparison signal COMP_RES is changed from the first logic level to the second logic level.

In FIG. 10, a value of the pre-read latency signal LAT_P is 8. If the number of the comparing operation is sufficiently large, the upload signal UP_LOAD is enabled, and the adder 1129 included in the read latency detector 1120 adds the inherent latency signal DRAM_CL of the semiconductor memory device 1500 to the pre-read latency signal LAT_P to generate the read latency signal RD_LAT. In FIG. 10, the upload signal UP_LOAD is enabled after the read latency detector 1120 performs the comparing operation 32 times.

Figure 11:
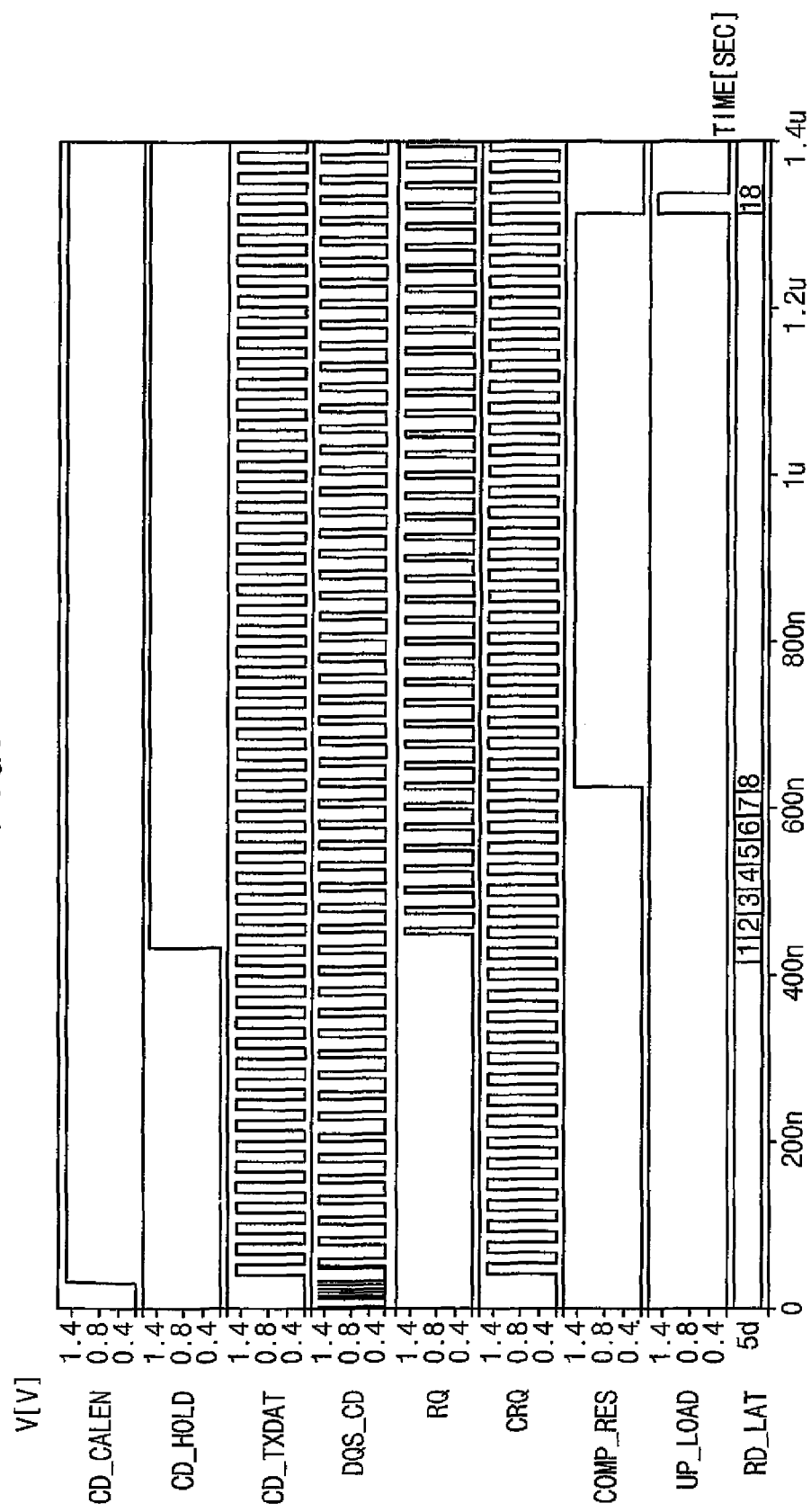
FIG. 11 is a diagram illustrating simulation results of an operation of the memory controller of FIG. 4.

FIG. 11 is a diagram illustrating simulation results of an operation of the memory controller 1100 of FIG. 4. Signals illustrated in FIG. 11 may correspond to the signals illustrated in FIG. 10.

Referring to FIG. 11, the value of the pre-read latency signal LAT_P is the number of times the comparing operation is performed after the third signal RQ is generated until the logic level of the comparison signal COMP_RES is changed from logic low level to logic high level. For example, the value of the pre-read latency signal LAT_P is the number of generated pulses of the third signal RQ until the logic level of the comparison signal COMP_RES is changed from logic low level to logic high level.

The value of the read latency signal RD_LAT of the memory system 1000 may be calculated by adding the value of the inherent latency signal of semiconductor memory device 1500 to the value of the pre-read latency signal LAT_P. In FIG. 11, the value of the pre-read latency signal LAT_P is about 8 and the value of the inherent latency signal of semiconductor memory device 1500 is about 10, and thus the value of the read latency signal RD_LAT of the memory system 1000 is about 18.

Figure 12:
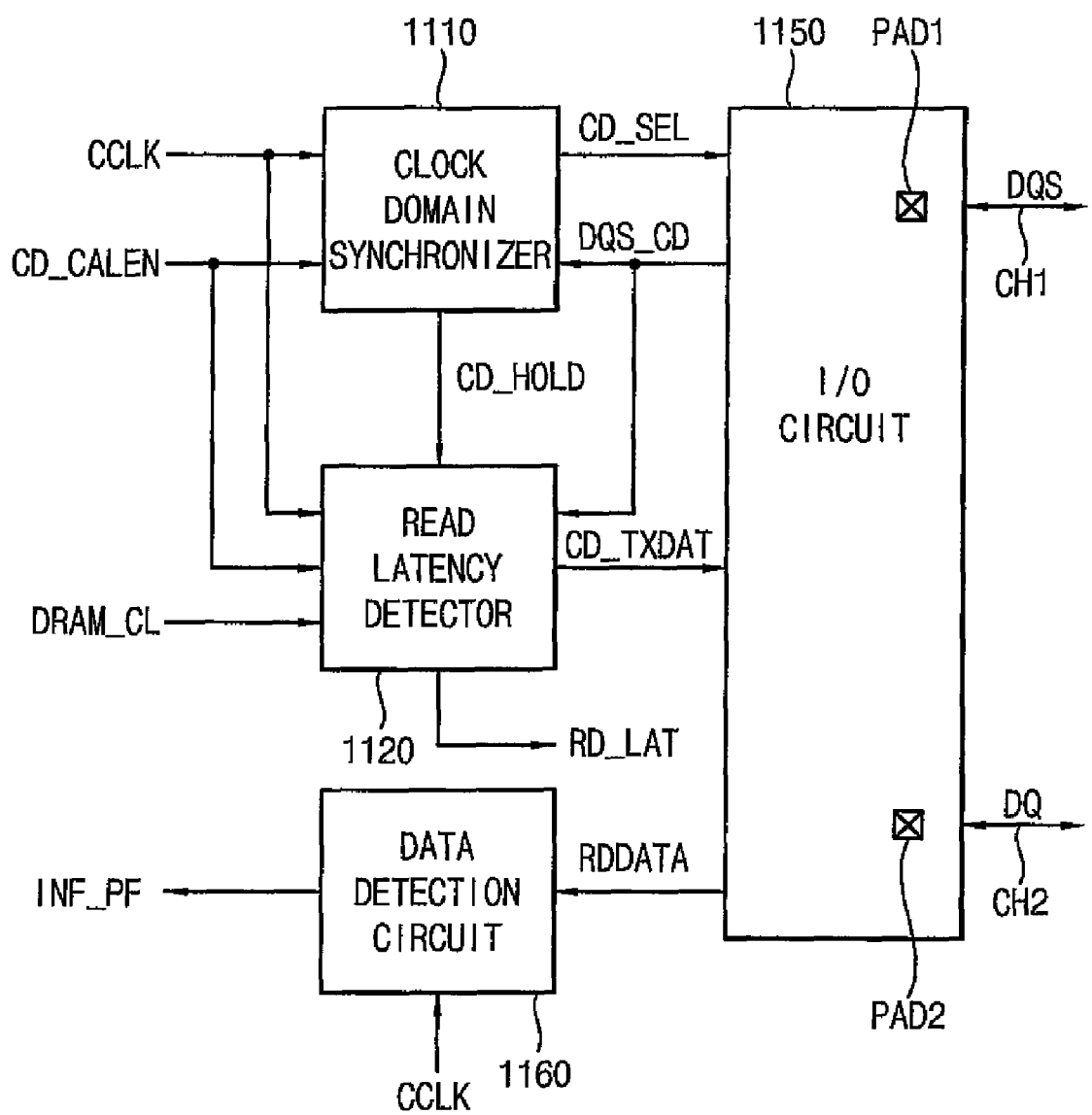
FIG. 12 is a block diagram illustrating another example of a memory controller included in the memory system of FIG. 1.

FIG. 12 is a block diagram illustrating another example of a memory controller 1200 included in the memory system 1000 of FIG. 1.

Referring to FIG. 12, the memory controller 1200 includes the clock domain synchronizer 1110, a read latency detector 1120, an input/output (I/O) circuit 1150 and a data detection circuit 1160.

The read latency detector 1120 generates a first signal CD_TXDAT in response to a system clock signal CCLK and a calibration enable signal CD_CALEN, and generates a read latency signal RD_LAT based on the system clock signal CCLK, a hold signal CD_HOLD, a second signal DQS_CD and an inherent latency signal DRAM_CL of the semiconductor memory device 1500. The semiconductor memory device 1500 may be a Dynamic Random Access Memory (DRAM). The first signal CD_TXDAT is transmitted to the semiconductor memory device 1500 through the I/O circuit 1150 and the first channel CH1, and is reflected at the input terminal of the semiconductor memory device 1500. The reflected signal of the first signal CD_TXDAT returns from the semiconductor memory device 1500 through the first channel CH1 and the I/O circuit 1150. The second signal DQS_CD is generated in response to the reflected signal.

The clock domain synchronizer 1110 generates a delay selection signal CD_SEL and the hold signal CD_HOLD based on the system clock signal CCLK, the calibration enable signal CD_CALEN and the second signal DQS_CD.

The I/O circuit 1150 transmits the first signal CD_TXDAT to the semiconductor memory device 1500 through a first pad PAD1 and the first channel CH1, and generates the second signal DQS_CD in response to the reflected signal. The I/O circuit 1150 delays the reflected signal in response to the delay selection signal CD_SEL to generate the second signal DQS_CD. The I/O circuit 1150 generates read data RDDATA in response to data DQ received from the semiconductor memory device 1500 through the second channel CH2 and a second pad PAD2. The read data RDDATA may include odd-numbered data D_F and even-numbered data D_S.

The data detection circuit 1160 samples the read data RDDATA in response to the system clock signal CCLK to generate a test information signal INF_PF.

Figure 13:
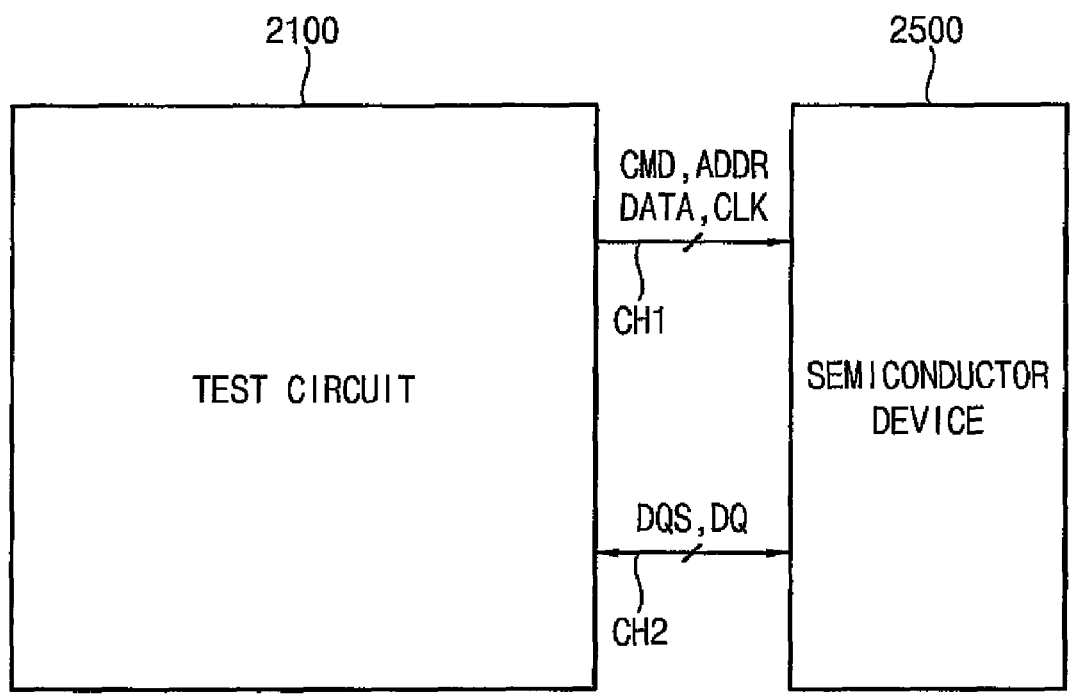
FIG. 13 is a block diagram illustrating a test system according to an example embodiment of the inventive concept.

FIG. 13 is a block diagram illustrating a test system 2000 according to an example embodiment.

Referring to FIG. 13, the test system 2000 includes a test circuit 2100 and a semiconductor device 2500.

The test circuit may include the memory controller 1100 of FIG. 4 or the memory controller 1200 of FIG. 12.

The test circuit 2100 transmits a command signal CMD, an address signal ADDR, a first data DATA and a clock signal CLK to the semiconductor device 2500 through a first channel CH1, and receives a data strobe signal DQS and a second data DQ from the semiconductor device 2500 through a second channel CH2. In a test mode, the test circuit 2100 may compare the first data DATA with the second data DQ to determine whether the semiconductor device 2500 passed or failed.

In a calibration mode, the test circuit 2100 generates a first signal, transmits the first signal to the semiconductor device 2500, generates a second signal in response to a reflected signal returned from the semiconductor device 2500, synchronizes the second signal with a system clock signal, and compares the second signal with the first signal to generate a read latency signal. The reflected signal returns from the semiconductor device 2500 to the test circuit 2100 by reflection of the first signal transmitted to the semiconductor device 2500. The test circuit 2100 may detect a read latency of the test system 2000 in response to the read latency signal.

In FIG. 13, the first and second channels CH1 and CH2 may include a plurality of channels, respectively.

Figure 14:
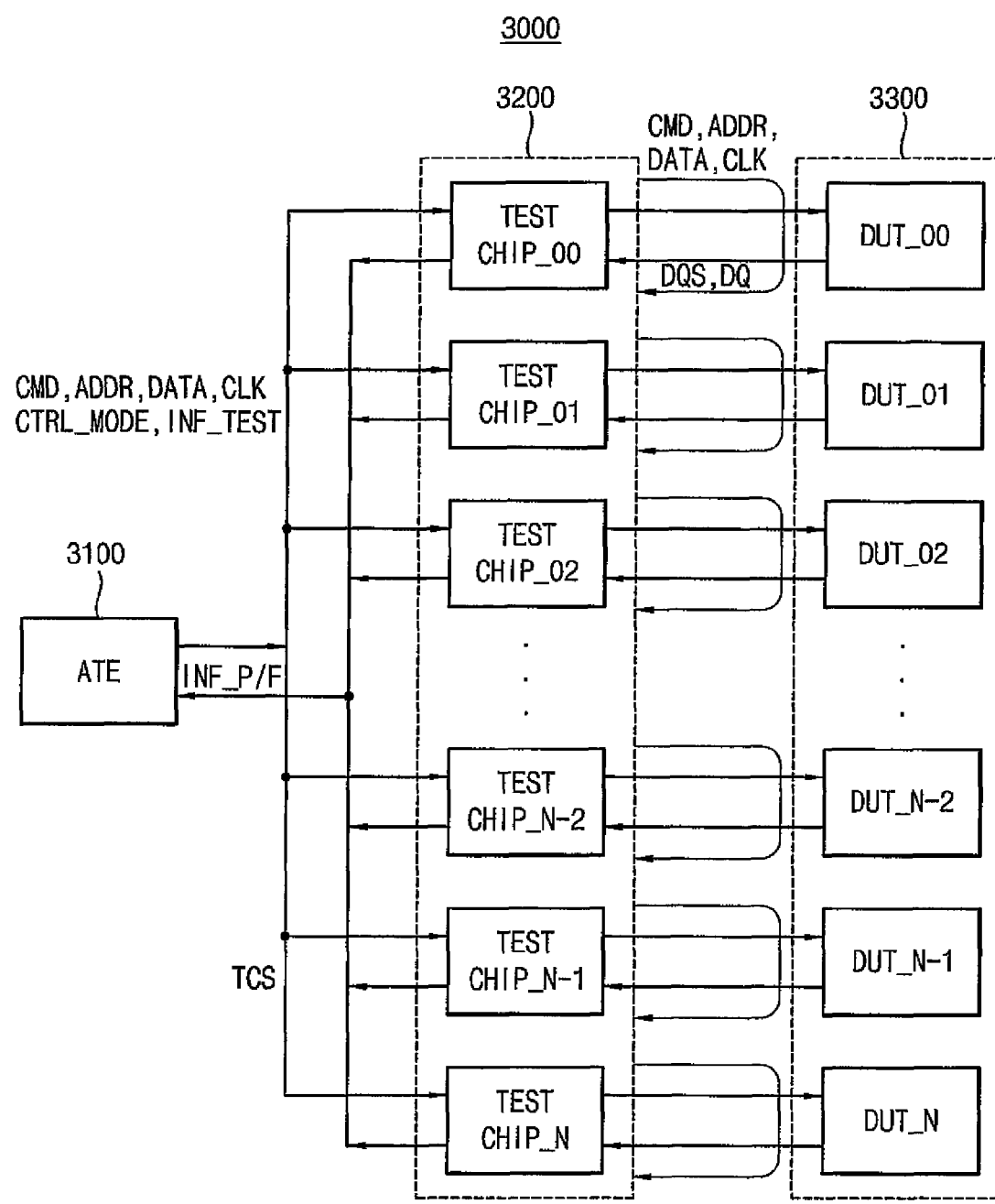
FIG. 14 is a block diagram illustrating a test system according to another example embodiment of the inventive concept.

FIG. 14 is a block diagram illustrating a test system 3000 according to another example embodiment.

Referring to FIG. 14, the test system 3000 includes an automatic test equipment (ATE) 3100, a test circuit 3200 and a plurality of device under tests (DUTs) 3300.

The ATE 3100 transmits a command signal CMD, an address signal ADDR, a first data DATA, a clock signal CLK, a mode control signal CTRL_MODE and a test information signal INF_TEST to the test circuit 3200, and receives a test result information signal INF_P/F from the test circuit 3200. The ATE 3100 may transmit a calibration starting signal TCS to the test circuit 3200.

The test circuit 3200 provides the command signal CMD, the address signal ADDR, the first data DATA and the clock signal CLK to the plurality of DUTs 3300 and receives a data strobe signal DQS and a second data DQ from the plurality of DUTs 3300. The test circuit 3200 may compare the first data DATA with the second data DQ to determine whether the plurality of DUTs 3300 passed or failed in a test mode.

The test circuit 3200 includes a plurality of test chips TEST CHIP_00, TEST CHIP_01, TEST CHIP_02, . . . , TEST CHIP_N−2, TEST CHIP_N−1, and TEST CHIP_N. The plurality of DUTs 3300 includes a first DUT DUT_00, a second DUT DUT_01, . . . , a n-th DUT DUT_N. Each of the test chips may include the memory controller 1100 of FIG. 4 or the memory controller 1200 of FIG. 12. Each of the test chips may also communicate with each of the DUTs corresponding to the each of the test chips.

For example, a first test chip TEST CHIP_00 provides the command signal CMD, the address signal ADDR, the first data DATA and the clock signal CLK to the first DUT DUT_00, and receives the data strobe signal DQS and the second data DQ from the first DUT DUT_00. The first test chip TEST CHIP_00 compares the first data DATA with the second data DQ to determine whether the first DUT DUT_00 is passed or failed in a test mode.

The test system 3000 may set a plurality of valid windows of the data read from the plurality of the DUTs 3300 based on a plurality of read latencies detected by the plurality of test chips 3200, respectively. The test system 3000 may also determine whether the plurality of DUTs 3300 passed or failed by comparing the first data DATA with the second data DQ.

Figure 15:
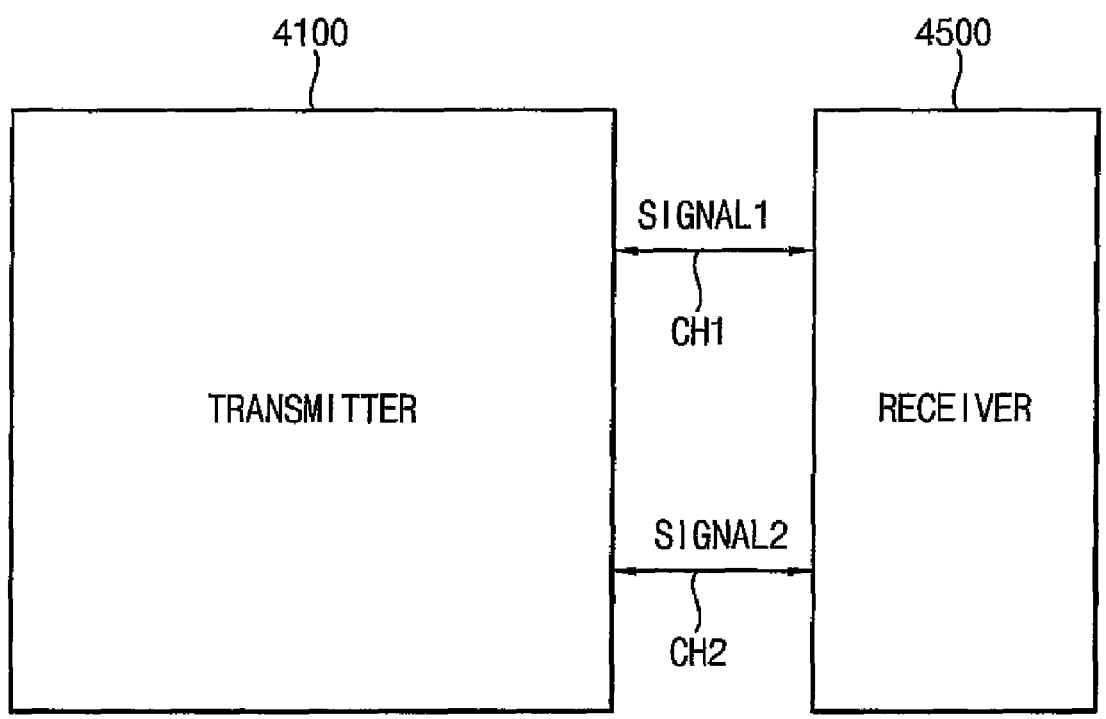
FIG. 15 is a block diagram illustrating a communication system according to an example embodiment.

FIG. 15 is a block diagram illustrating a communication system according to an example embodiment.

Referring to FIG. 15, the communication system 4000 includes a transmitter 4100 and a receiver 4500.

The transmitter 4100 may include the memory controller 1100 of FIG. 4 or the memory controller 1200 of FIG. 12. The transmitter 4100 transmits a first signal SIGNAL1 to the receiver 4500, and receives the first signal SIGNAL1 from the receiver 4500 through a first channel CH1. The transmitter 4100 transmits a second signal SIGNAL2 to the receiver 4500, and receives the second signal SIGNAL2 from the receiver 4500 through a second channel CH2. The first and second channels CH1 and CH2 may include a plurality of channels, respectively. Each of the channels may transmit at least one of the signals.

In a calibration mode, the transmitter 4100 generates a first compensation signal, transmits the first compensation signal to the receiver 4500, generates a second compensation signal in response to a reflected signal returned from the receiver 4500, synchronizes the second compensation signal with a system clock signal, and compares the second compensation signal with the first compensation signal to generate a read latency signal. The reflected signal returns from the receiver 4500 to the transmitter 4100 by reflection of the first compensation signal transmitted to the receiver 4500. The transmitter 4100 may detect a read latency of the communication system 4000 in response to the read latency signal.

As described above, the inventive concept may be used in a communication system including a transmitter and a receiver. The inventive concept may also be used in a memory system sampling data by using a clock signal.

While the example embodiments and their advantages have been described in detail, it should be understood that various changes, substitutions and alterations may be made herein without departing from the scope of the inventive concept.

What is claimed is:

1. A memory controller comprising:
   an input/output (I/O) circuit configured to transmit a first signal to a semiconductor memory device, to receive a reflected signal returned from the semiconductor memory device, and to delay the reflected signal in response to a delay selection signal to generate a second signal, the reflected signal being provided by reflection of the first signal from the semiconductor memory device;
   a read latency detector configured to generate the first signal in response to a system clock signal, and to generate a read latency signal based on the system clock signal, a hold signal, and the second signal; and
   a clock domain synchronizer configured to generate the delay selection signal and the hold signal based on the system clock signal and the second signal.

2. The memory controller of claim 1, wherein the read latency detector generates a pre-read latency signal based on the system clock signal, the hold signal and the second signal, and generates the read latency signal by adding an inherent latency signal of the semiconductor memory device to the pre-read latency signal.

3. The memory controller of claim 1, wherein the read latency detector compares a third signal corresponding to the second signal with a fourth signal corresponding to the first signal, to generate the read latency signal.

4. The memory controller of claim 3, wherein the read latency detector includes:
   a flip-flop configured to sample the third signal in response to the fourth signal to generate a comparison signal.

5. The memory controller of claim 4, wherein the read latency detector includes:
a counter configured to count a number of pulses of the third signal until a logic level of the comparison signal transitions from a first logic level to a second logic level, and to generate a pre-read latency signal responsive to the counted number of pulses.

6. The memory controller of claim 5, wherein the read latency detector includes:
an AND gate configured to perform an AND operation on the second signal and the hold signal;
a flip-flop configured to sample an output signal of the AND gate in response to the system clock signal, to generate the third signal;
a transmission signal generator configured to generate a fifth signal based on a calibration enable signal and the system clock signal; and
a clock-based delay circuit configured to delay the fifth signal in response to the system clock signal and the pre-read latency signal, to generate the fourth signal.

7. The memory controller of claim 1, wherein the I/O circuit outputs read data in response to data received from the semiconductor memory device.

8. The memory controller of claim 1, wherein the clock domain synchronizer includes:
a phase detector configured to detect a phase of the second signal in response to the system clock signal;
a timer configured to generate the hold signal based on a calibration enable signal and the second signal; and
a shift register configured to generate the delay selection signal based on the hold signal and an output signal of the phase detector.

9. A memory system comprising:
a semiconductor memory device; and
a memory controller configured to generate a first signal, to transmit the first signal to the semiconductor memory device, to generate a second signal in response to a reflected signal returned from the semiconductor memory device, to synchronize the second signal with a system clock signal, and to compare the second signal with the first signal to generate a read latency signal, the reflected signal being provided by reflection of the first signal from the semiconductor memory device.

10. The memory system of claim 9, wherein the memory controller includes:
an input/output (I/O) circuit configured to transmit the first signal to the semiconductor memory device, to receive the reflected signal returned from the semiconductor memory device, and to delay the reflected signal in response to a delay selection signal to generate the second signal;
a read latency detector configured to generate the first signal in response to the system clock signal, and to generate the read latency signal based on the system clock signal, a hold signal and the second signal; and
a clock domain synchronizer configured to generate the delay selection signal and the hold signal based on the system clock signal and the second signal.

11. The memory system of claim 10, wherein the read latency detector generates a pre-read latency signal based on the system clock signal, the hold signal and the second signal, and generates the read latency signal by adding an inherent latency signal of the semiconductor memory device to the pre-read latency signal.

12. The memory system of claim 10, wherein the read latency detector compares a third signal corresponding to the second signal with a fourth signal corresponding to the first signal, to generate the read latency signal.

13. The memory system of claim 12, wherein the read latency detector includes:
a flip-flop configured to sample the third signal in response to the fourth signal, to generate a comparison signal.

14. The memory system of claim 13, wherein the read latency detector includes:
a counter configured to count a number of pulses of the third signal until a logic level of the comparison signal transitions from a first logic level to a second logic level, and to generate a pre-read latency signal responsive to the counted number of pulses.

15. The memory system of claim 14, wherein the read latency detector includes:
an AND gate configured to perform an AND operation on the second signal and the hold signal;
a flip-flop configured to sample an output signal of the AND gate in response to the system clock signal CCLK, to generate the third signal;
a transmission signal generator configured to generate a fifth signal based on a calibration enable signal and the system clock signal; and
a clock-based delay circuit configured to delay the fifth signal in response to the system clock signal and the pre-read latency signal, to generate the fourth signal.

16. The memory system of claim 10, wherein the I/O circuit outputs read data in response to data received from the semiconductor memory device.

17. The memory system of claim 10, wherein the clock domain synchronizer includes:
a phase detector configured to detect a phase of the second signal in response to the system clock signal;
a timer configured to generate the hold signal based on a calibration enable signal and the second signal; and
a shift register configured to generate the delay selection signal based on the hold signal and an output signal of the phase detector.

18. A test system comprising:
a semiconductor device; and
a test circuit configured to generate a first signal, to transmit the first signal to the semiconductor device, to generate a second signal in response to a reflected signal returned from the semiconductor device, to synchronize the second signal with a system clock signal, to compare the second signal with the first signal to generate a read latency signal in a calibration mode, and to compare a first data transmitted to the semiconductor device with a second data received from the semiconductor device to determine whether the semiconductor device passes or fails in a test mode.

19. The test system of claim 18, wherein the test circuit includes:
an input/output (I/O) circuit configured to transmit the first signal to the semiconductor device, to receive the reflected signal returned from the semiconductor device, and to delay the reflected signal in response to a delay selection signal to generate the second signal, the reflected signal being provided by reflection of the first signal from the semiconductor device;
a read latency detector configured to generate the first signal in response to the system clock signal, and to generate the read latency signal based on the system clock signal, a hold signal and the second signal; and
a clock domain synchronizer configured to generate the delay selection signal and the hold signal based on the system clock signal and the second signal.

* * * * *